(12) United States Patent
Batruni

(10) Patent No.: US 6,999,510 B2
(45) Date of Patent: *Feb. 14, 2006

(54) NONLINEAR INVERSION

(75) Inventor: Roy G. Batruni, Danville, CA (US)

(73) Assignee: Optichron, Inc., Fremont, CA (US)

( * ) Notice: Subject to any disclaimer, the term of this patent is extended or adjusted under 35 U.S.C. 154(b) by 135 days.

This patent is subject to a terminal disclaimer.

(21) Appl. No.: 10/418,944

(22) Filed: Apr. 18, 2003

(65) Prior Publication Data

US 2004/0208242 A1    Oct. 21, 2004

(51) Int. Cl.
*H03K 7/04*    (2006.01)
(52) U.S. Cl. ............ 375/239; 327/552; 708/322
(58) Field of Classification Search ......... 375/239, 375/232, 341; 327/552
See application file for complete search history.

(56) References Cited

U.S. PATENT DOCUMENTS

| | | | | |
|---|---|---|---|---|
| 4,484,338 | A * | 11/1984 | Clark et al. ............. | 375/341 |
| 4,843,583 | A * | 6/1989 | White et al. ............ | 708/322 |
| 6,449,110 | B1 * | 9/2002 | DeGroat et al. ........ | 360/46 |
| 6,463,099 | B1 * | 10/2002 | Cao et al. .............. | 375/232 |
| 6,813,322 | B2 * | 11/2004 | Fulghum et al. ....... | 375/341 |
| 6,856,191 | B2 * | 2/2005 | Bartuni ................. | 327/552 |

OTHER PUBLICATIONS

Frank, Walter A., "An Efficient Approximation to the Quadratic Volterra Filter and Its Application I Realtime Loudspeaker Linearization", Universitat der Bundeswehr Munchen, D85577 Neubiberg Germany.

Frank, Walter A., "On the Equalization of Nonlinear Systems", 30th Asilomar Conference on Signals, Systems and Computers, Nov. 1996.

Giannakis, Georgios B., "Blind Franctionally Spaced Equalization of Noisy FIR Channels: Direct and Adaptive Solutions", IEEE Transactions on Signal Processing, vol. 45, No. 9, Sep. 1997.

Griffith, David W., Jr. et al, "Partially Decoupled Volterra Filters: Formulation and LMS Adaptation" Dept. of Electrical Engineering, University of Delware, Newark, Delaware.

Schulz-Mirbach, Hanns, "Nonlinear Model-Based Analysis and Description of Images for Multimedia Applications", Internal Report Jul. 1996, TU Hamburg-Harburg, Technische Informatik I, Oct. 1996.

* cited by examiner

*Primary Examiner*—Stephen Chin
*Assistant Examiner*—Jaison Joseph
(74) *Attorney, Agent, or Firm*—Van Pelt, Yi & James LLP

(57) ABSTRACT

A method for processing a signal propagated through a nonlinear channel is disclosed. The method comprises modeling the channel characteristics to produce a linearized channel model, wherein the linearized channel model has a linearized transfer function that includes a plurality of first order polynomials and nonlinear operators. The method further comprises deriving an inverse linearized channel model from the linearized channel model and filtering the signal using the inverse linearized channel model.

19 Claims, 9 Drawing Sheets

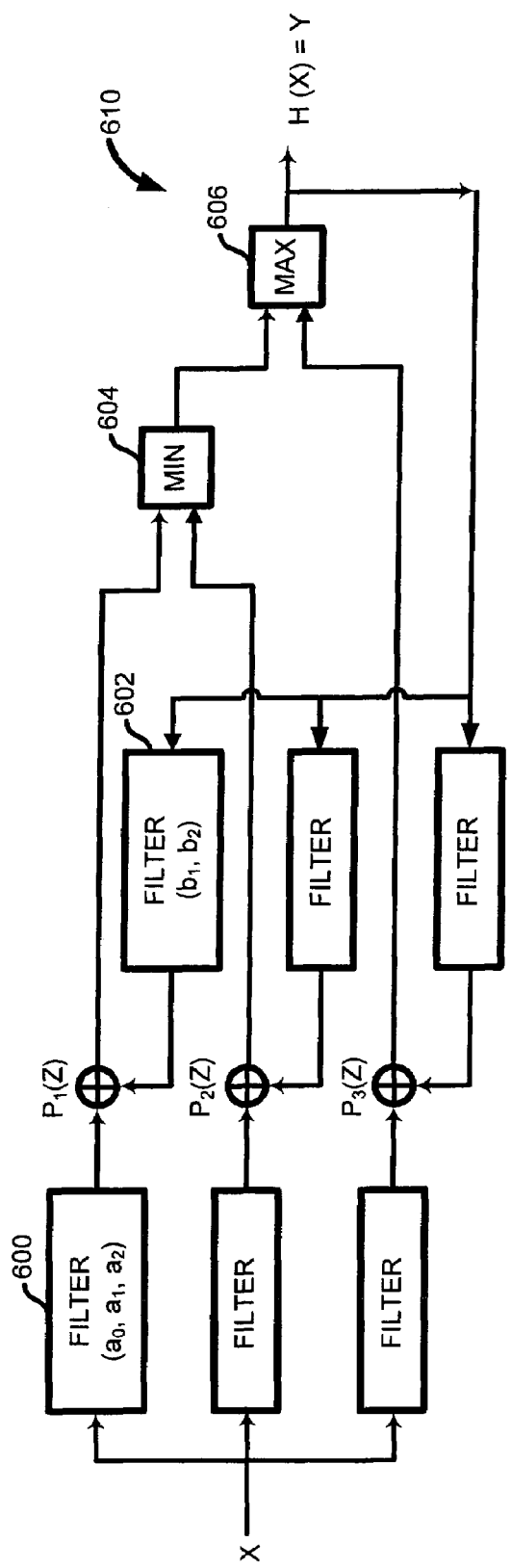
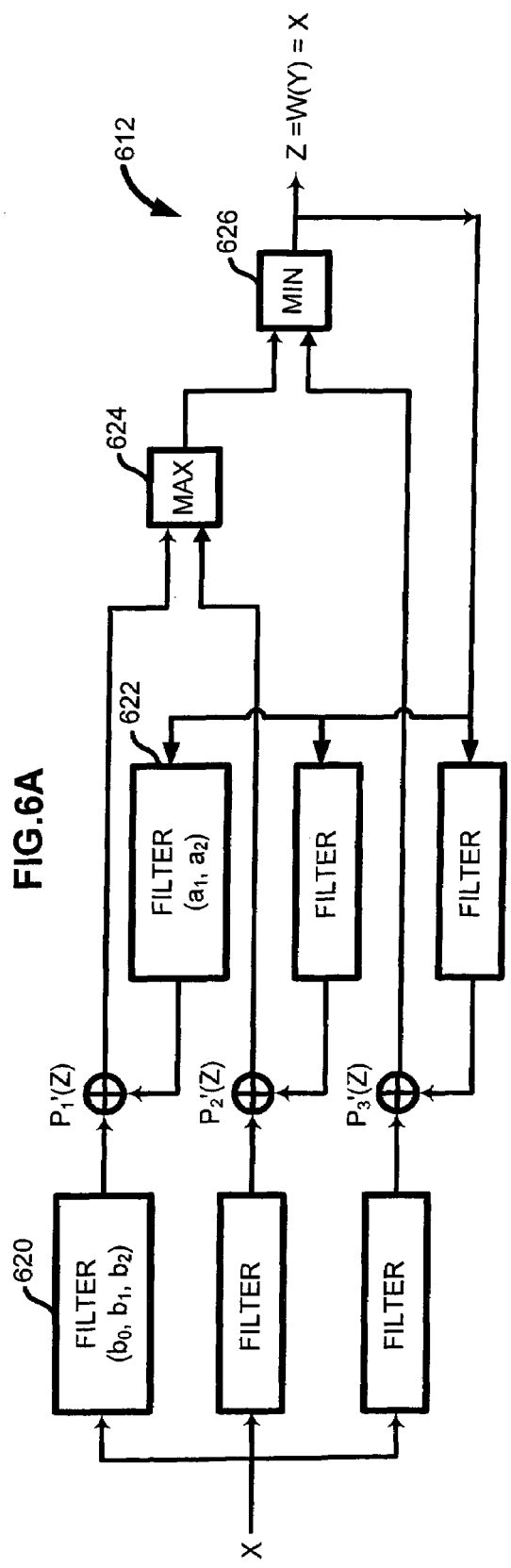
FIG.6A
FIG.6B

NONLINEAR INVERSION

FIELD OF THE INVENTION

The present invention relates generally to signal processing. More specifically, the processing of a signal propagated through a nonlinear channel is disclosed.

BACKGROUND OF THE INVENTION

In digital communication systems, a signal is often transmitted to a receiver via a channel that may be described using a transfer function. The receiver may implement a filter whose transfer function is substantially the inverse of the channel transfer function in order to undo the effect of channel and facilitate recovery of the signal. FIG. 1A is a block diagram illustrating a receiver filter used to receive a signal transmitted through a linear channel. In the block diagram, the signal is transmitted through a linear channel 100. The relationship between the output, Y, and the input, X, is expressed as a linear equation $$Y = aX + b \qquad \text{(Equation 1)}$$

where a and b are constant coefficients. The inverse of the linear equation, $$Z = \frac{Y - b}{a} \qquad \text{(Equation 2)}$$

leads to a relatively straightforward implementation of receiver filter 102 using linear digital filters.

FIG. 1B is a block diagram illustrating a receiver filter used to receive a signal transmitted through a nonlinear channel. In the block diagram, the signal is transmitted through a nonlinear channel 104. The transfer function characterizing the channel in this case is expressed as $$Y = aX + cX^3 + b \qquad \text{(Equation 3)}$$

Although this is a simplified Volterra series limited to one cubic term, its inverse includes an infinite number of terms. Thus, the design of receiver filter 106 becomes complex, and cannot be easily achieved using conventional linear filters. Generally, the complexity of receiver filter design tends to increase for transfer functions that include higher order polynomials.

In reality, many transmission channels are nonlinear. The challenges involved in inverting the transfer functions of nonlinear channels make it difficult to design receiver filters. Signal degradation, distortion and instability are often results of suboptimal receiver filter design. It would be useful to have a technique that would overcome the problems associated with receiver design for nonlinear channels and would result in channel inverting filters that can be implemented more easily.

BRIEF DESCRIPTION OF THE DRAWINGS

The present invention will be readily understood by the following detailed description in conjunction with the accompanying drawings, wherein like reference numerals designate like structural elements, and in which:

FIG. 6A is a block diagram illustrating an infinite impulse response (IIR) filter embodiment.

FIG. 6B is a block diagram illustrating an inverse filter embodiment for the filter shown in FIG. 6A.

DETAILED DESCRIPTION

Figure 1A:
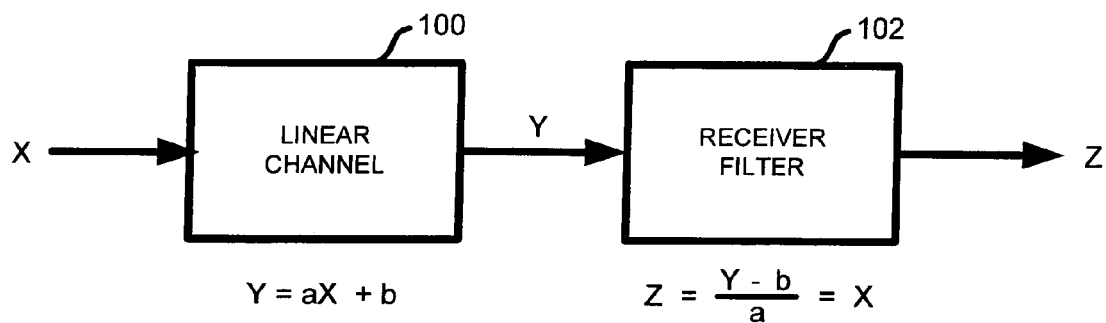
FIG. 1A is a block diagram illustrating a receiver filter used to receive a signal transmitted through a linear channel.

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An improved technique for processing a signal propagated through a nonlinear channel is disclosed. In some embodiments, the nonlinear channel is modeled using a linearization technique. The transfer function and configurations of an inverse filter for filtering the received signal are derived based on the linearized channel model. The inverse filter and its configurations are derived through an adaptive process. The linearized channel model and its inverse remain nonlinear, but each can be realized using linear filters, nonlinear elements and a combination network.

In this specification, a nonlinear channel refers to a transmission medium, a circuit, a combination of transmission mediums and circuits, or anything else that provides a path for a signal to propagate. The transfer characteristics of a nonlinear channel can be modeled as a nonlinear filter. Several techniques for nonlinear channel modeling are described in co-pending U.S. patent application Ser. No. 10/372,638 by Batruni entitled NONLINEAR FILTER, filed Feb. 21, 2003, which is incorporated herein by reference for all purposes. According to Batruni, a linearized channel model can be used to model the nonlinear channel. The linearized channel model is an approximation of the original nonlinear channel, obtained using approximation techniques such as least mean square (LMS). The transfer function of a linearized nonlinear channel model is referred to as the linearized transfer function, which can be expressed using first order polynomials and nonlinear operators. Even though the plot of a linearized transfer function is comprised of linear segments, the function has nonlinear properties due to its nonlinear operators.

For example, a transfer function described by Equation 3 can be modeled as:

$$Y = aX + b + \sum_{j=1}^{N} c_j |\alpha_j X + \beta_j| \quad \text{(Equation 4)}$$

where a, b, N, $c_j$, $\alpha_{j,}$ and $\beta_j$ are constants derived using techniques such as LMS. This type of linearized functions can be implemented using linear filters, nonlinear elements such as absolute value operators or min-max processors, and a combination network.

In some embodiments, the receiver compensates the effects of the nonlinear channel and recovers the signal. This is generally accomplished by using an inverse filter with a transfer function that is the inverse of the linearized transfer function. In some embodiments, to construct the inverse filter, an inverse linearized channel model is derived from the linearized model.

For the purpose of example, a linearized channel model with an N of 2 is discussed in detail. It should be noted that better approximation may be achieved by using a larger N and including more terms in the transfer function. In this case, the linearized function with an N of 2 is expressed as:

$$Y = aX + b + c_1|\alpha_1 X + \beta_1| + c_2|\alpha_2 X + \beta_2| \quad \text{(Equation 5)}$$

Let $u_1 = \text{sign}(\alpha_1 X + \beta_1)$ and $u_2 = \text{sign}(\alpha_2 X + \beta_2)$, then Equation 5 can be rewritten as:

$$Y = aX + b + c_1 u_1 \alpha_1 X + c_1 u_1 \beta_1 + c_2 u_2 \alpha_2 X + c_2 u_2 \beta_2 \quad \text{(Equation 6)}$$

The inverse of the above function is:

$$X = \frac{Y - [b + (c_1 u_1 \beta_1 + c_2 u_2 \beta_2)]}{a + c_1 u_1 \alpha_1 + c_2 u_2 \alpha_2} \quad \text{(Equation 7)}$$

Figure 2A:
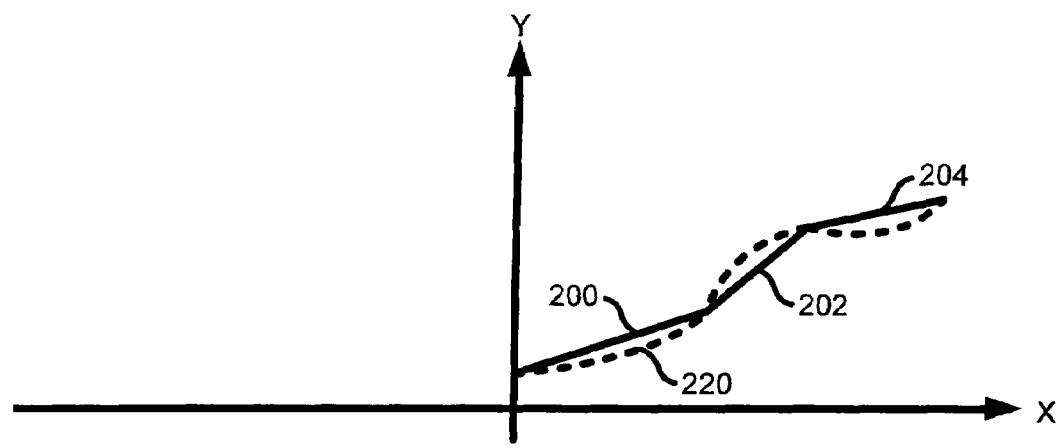
FIG. 2A is a plot illustrating a transfer function of a nonlinear channel.
Figure 2B:
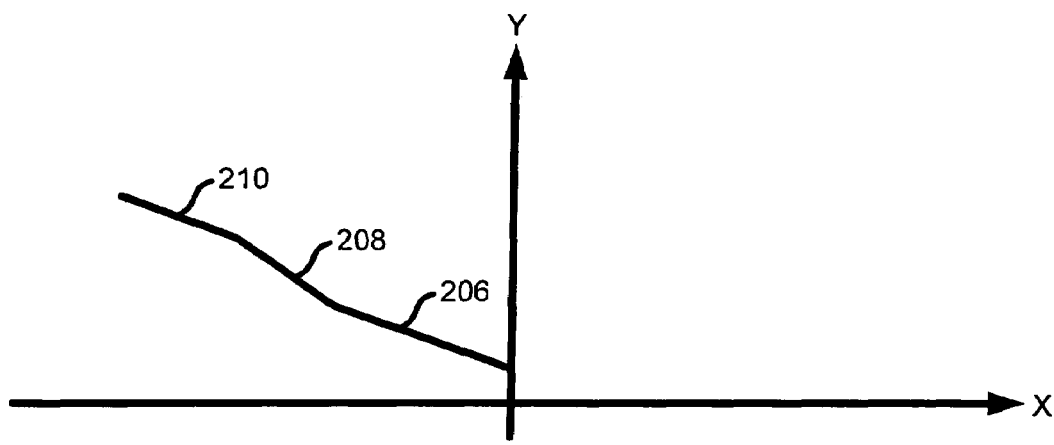
FIG. 2B is a plot illustrating a mirror image of the linearized function shown in FIG. 2A with respect to the y-axis.
Figure 2C:
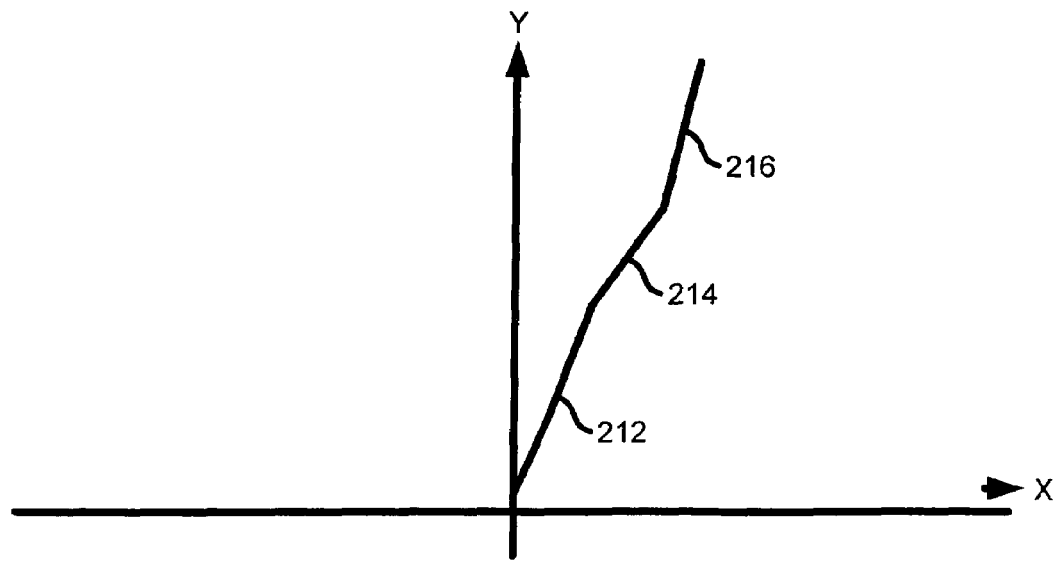
FIG. 2C is a plot illustrating a rotated image of the function shown in FIG. 2B.

The inverse is a function with first order polynomials. It may be derived using various methods, including algebraic computation and linear transformation. FIGS. 2A–2C are plots illustrating a linear transformation process for deriving the inverse of a linearized function. FIG. 2A is a plot illustrating a transfer function of a nonlinear channel. The transfer function is shown as dashed line 220. Its linearized approximation function includes line segments 200, 202 and 204. The transitions between the line segments occur as a result of the absolute value operations, giving the function its nonlinear characteristics.

FIG. 2B is a plot illustrating a mirror image of the linearized function shown in FIG. 2A with respect to the y-axis. Line segments 206, 208 and 210 are mirror images of 200, 202 and 204, respectively. FIG. 2C is a plot illustrating a rotated image of the function shown in FIG. 2B. The mirror image is rotated 90° with respect to the origin to produce a rotated function shown in FIG. 2C. Line segments 212, 214 and 216 are rotated mirror images of 200, 202, and 204, respectively. The resulting rotated function is the inverse of the linearized function. It should be noted that the above plots illustrate one of the methods for obtaining the inverse of a function. In other embodiments, different methods may be employed for the purposes of inverting the transfer function applied by the channel.

A linearized channel model, such as the one shown in Equation 5, may also be expressed as a series of minimum-maximum (or min-max) operations that select either the minimum or the maximum of inputs. Based on the linearized channel model, its inverse can be readily derived and implemented using linear filters combined with min-max processors. Consequently, the design of receiver filters for nonlinear channels can be greatly simplified.

Figure 3:
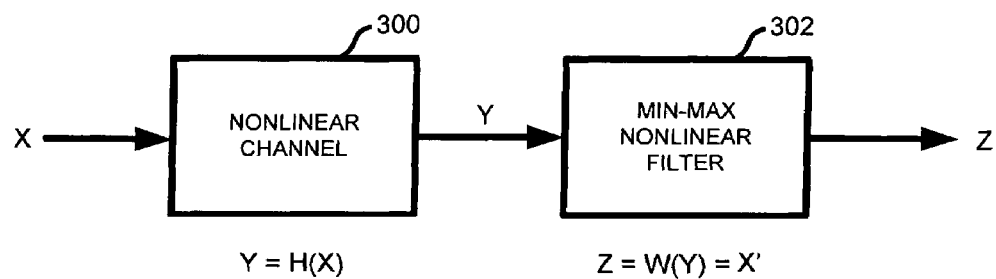
FIG. 3 is a block diagram illustrating the use of a min-max nonlinear filter according to one embodiment.

FIG. 3 is a block diagram illustrating the use of a min-max nonlinear filter according to one embodiment. A signal, X, is sent via a nonlinear channel 300 with a transfer function H(X), and the resulting signal Y is sent to the receiver. A linearized channel model of channel 300 is used to derive an inverse linearized channel model that has a transfer function W(Y). The receiver employs a min-max nonlinear filter 302 that is configured based on the inverse linearized channel model. Since the linearized channel model is an approximation of nonlinear channel 300, the output of min-max nonlinear filter 302, X', is approximately X. The linearized channel model and its inverse are refinable to reduce output error. The model can be refined so that the difference between X and X' is within some predefined range.

For example, returning to FIG. 2A, the linearized transfer function shown in the figure can be expressed using min-max operations. Segment 200 is a segment on a line, L1, that has the following transfer function:

$$L1 = Y = (a - c_1\alpha_1 - c_2\alpha_2)X + (b - c_1\beta_1 - c_2\beta_2) = A_1 X + B_1 \quad \text{(Equation 8)}$$

Similarly, segment 202 corresponds to line L2 with the following transfer function:

$$L2 = Y = (a - c_1\alpha_1 - c_2\alpha_2)X + (b - c_1\beta_1 - c_2\alpha_2) = A_2 X + B_2 \quad \text{(Equation 9)}$$

and segment 204 corresponds to line L3:

$$L3 = Y = (a + c_1\alpha_1 + c_2\alpha_2)X + (b + c_1\alpha_1 + c_2\alpha_2) = A_3 X + B_3 \quad \text{Equation 10)}$$

Thus, Equation 5 can be expressed as:

$$Y = \max(\min(L1, L2), L3) \quad \text{(Equation 11)}$$

A filter implemented using the linearized model has good noise characteristics because the linearized transfer function does not include higher order polynomials of the input signal. For example, the input noise for the transfer function shown in Equation 3 becomes cubed, but remains of first order for the linearized transfer function shown in Equation 11.

Figure 4A:
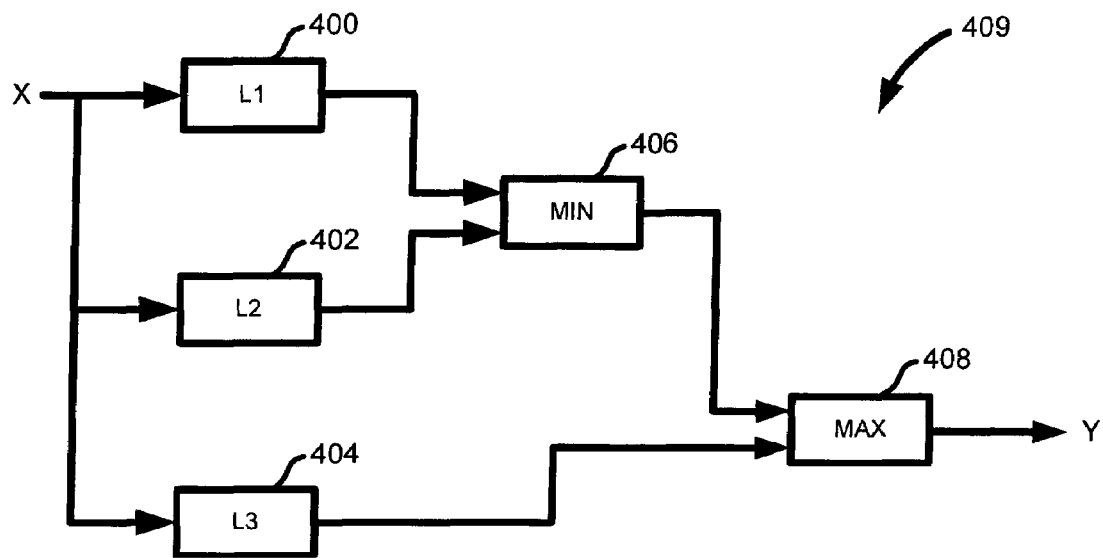
FIG. 4A illustrates a nonlinear filter embodiment that is implemented using linear filters, nonlinear elements and a combination network.
Figure 4B:
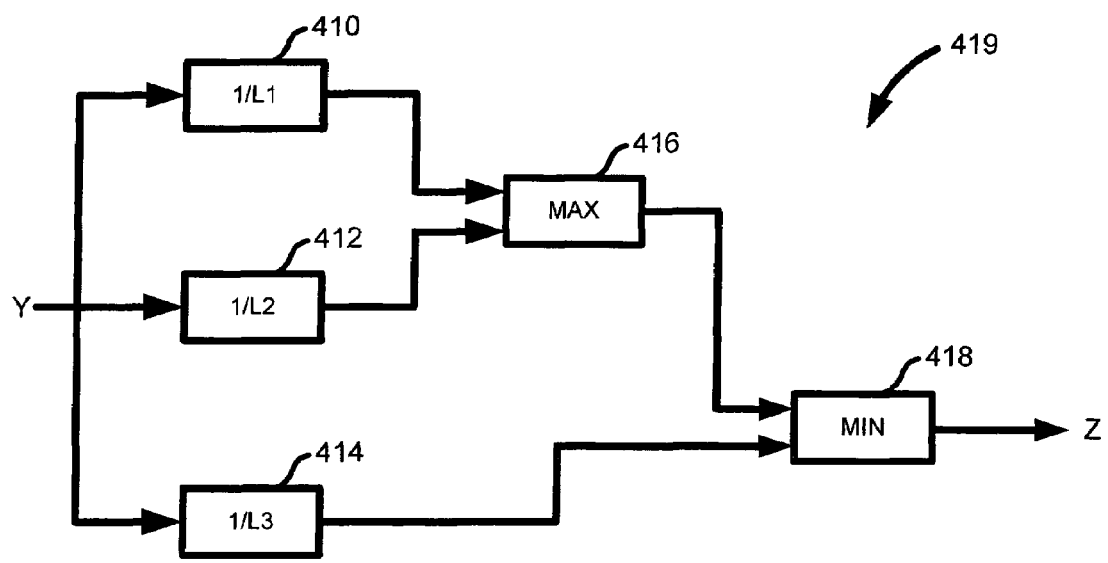
FIG. 4B is a block diagram illustrating an inverse filter embodiment.

An inverse of the linearized channel model can be derived by inverting the transfer functions of the linear filters and switching the functions of the min-max processors. An example is shown in FIGS. 4A–4B. FIG. 4A illustrates a nonlinear filter embodiment that is implemented using linear filters, nonlinear elements and a combination network. The transfer function of nonlinear filter 409 is as shown in Equation 5. The input, X, is sent to three linear filters 400, 402 and 404, which respectively have transfer functions characterized by functions L1, L2 and L3. The outputs of the filters are sent to a minimum processor 406 and a maximum processor 408. For the purpose of this specification, a minimum-maximum processor may be a part or the whole of an integrated circuit, one or more discrete components, a part or the whole of a software program, or any other appropriate hardware or software component useful for selecting a minimum or a maximum value from a plurality of inputs. In some embodiments, the processors are programmable to perform either the minimum function or the maximum function.

As shown, the processors are in a nested configuration, where the output of processor 406 is sent as an input to processor 408. It should be noted that in embodiments where a different transfer function is used, the number of min-max processors and their configuration in the min-max selection network may differ. In this case, the minimum processor selects the minimum output between filters 400 and 402. The maximum processor selects the maximum between the output of filter 404 and the output of the minimum processor. The resulting filter has a transfer function that is similar to the linearized function shown in FIG. 2A.

FIG. 4B is a block diagram illustrating an inverse filter embodiment. The transfer function of this filter, 419, is the inverse of the transfer function of filter 409. The input, Y, is sent to three linear filters 410, 412 and 414, which have corresponding transfer functions 1/L1, 1/L2 and 1/L3. The outputs of filters 410 and 412 are sent to a maximum operator 416. The output of the maximum operator is sent to minimum operator 418, as is the output of linear filter 414. By inverting the transfer functions of the linear filters and switching the functions of the min-max processors, the nonlinear filter shown in FIG. 4A is transformed to its own inverse filter. This is a technique useful for constructing and configuring receiver filters for nonlinear channels.

Figure 5:
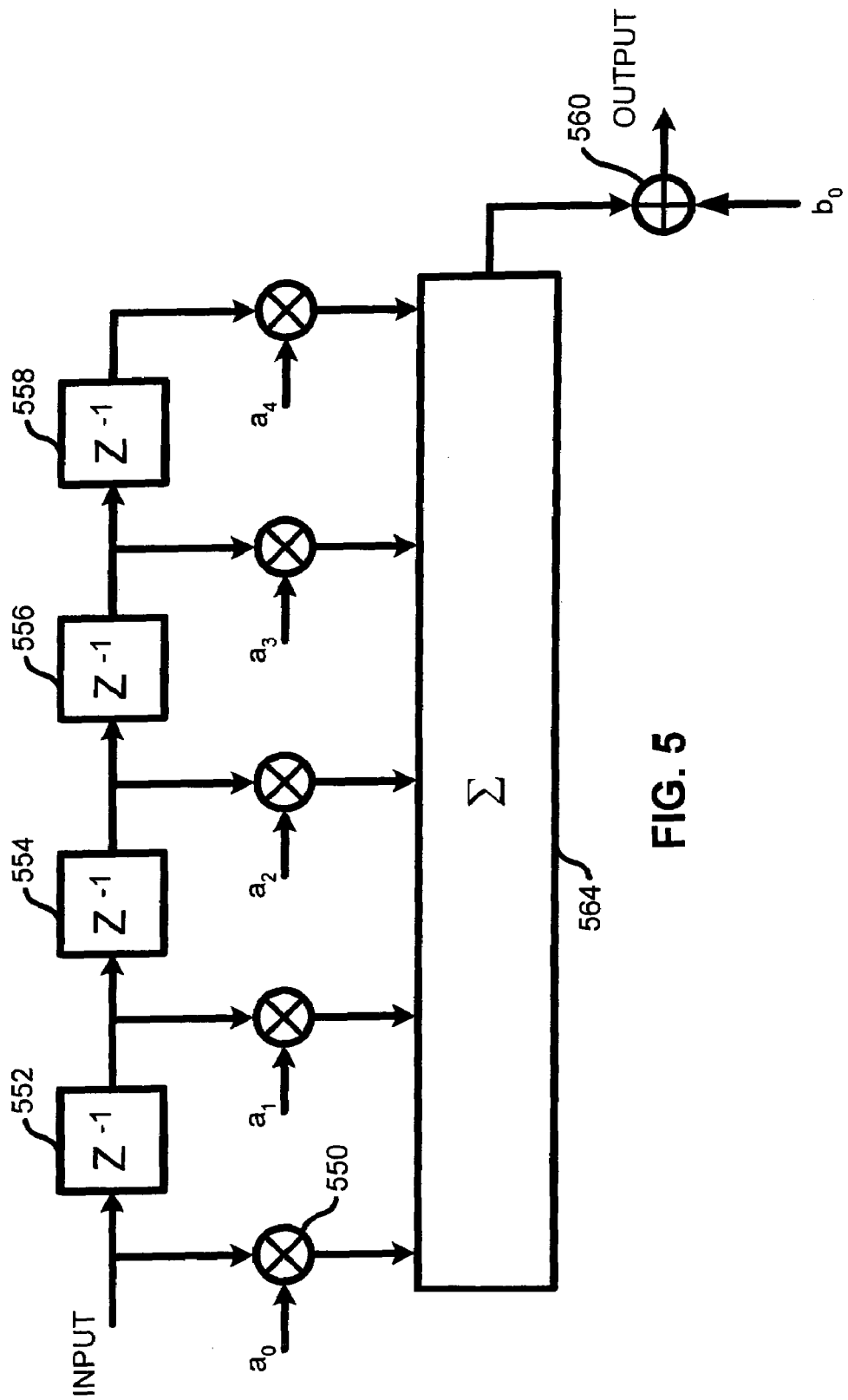
FIG. 5 is a circuit diagram illustrating the details of a linear filter embodiment used to implement the circuits shown in FIGS. 4A–4B.

FIG. 5 is a circuit diagram illustrating the details of a linear filter embodiment used to implement the circuits shown in FIGS. 4A–4B. The input is scaled by a factor $a_0$ using a multiplier 550. The input is also sent to a plurality of delay stages 552, 554, 556 and 558. The delayed signals are scaled by coefficients of $a1$, $a2$, $a3$ and $a4$. The scaled signals are combined by a combiner 564. A constant value $b_0$ is added to the combined result via another combiner 560 to generate the output. In some embodiments, a constant value is added to the scaled signals directly by combiner 554, thus combiner 560 is omitted. It should be noted that although FIG. 5 illustrates a linear filter architecture that is commonly used, different types of linear filters such as filters with feedback may be employed in other embodiments.

The inverse of a linear filter can be derived by switching the positions of poles with the positions of zeros. Switching the positions of poles and zeros is generally achieved by transposing feedforward filter coefficients with feedback filter coefficients. FIG. 6A is a block diagram illustrating an infinite impulse response (IIR) filter embodiment. In this embodiment, a plurality of linear filters and a plurality of min-max processors are combined together form a nonlinear filter 610 that is an IIR filter. The nonlinear filter includes three sets of linear filters, each including a feedforward filter and a feedback filter. The coefficients of the feedforward filter determine the positions of the zeros in the transfer function, and the coefficients of the feedback filter determine the position of the poles in the transfer function. For example, a feedforward filter 600 has a set of coefficients $a_0$, $a_1$ and $a_2$; a feedback filter 602 has a set of coefficients $b_0$, $b_1$ and $b_2$. These two filters are combined to form a linear filter with the following transfer function:

$$PI(z) = \frac{a_0 + a_1 z^{-1} + a_2 z^{-2}}{b_0 + b_1 z^{-1} + b_2 z^{-2}} \quad \text{(Equation 12)}$$

The outputs of the linear filters are sent to a combination network that includes minimum processor 604 and maximum processor 606. The transfer function of the resulting nonlinear IIR filter 610 is referred to as H(z).

FIG. 6B is a block diagram illustrating an inverse filter embodiment for the filter shown in FIG. 6A.

Figure 1B:
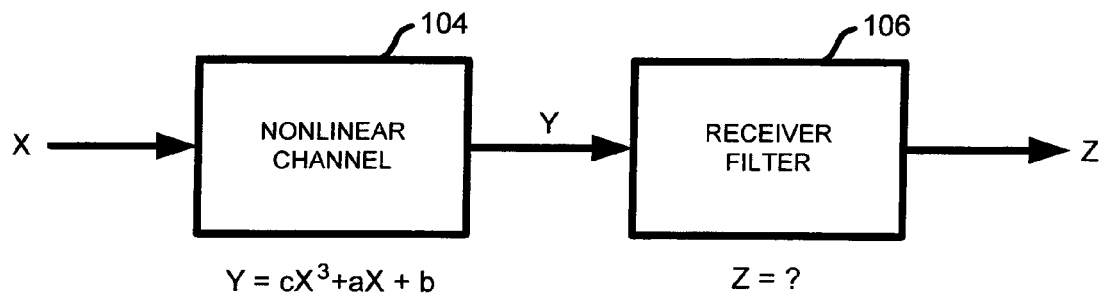
FIG. 1B is a block diagram illustrating a receiver filter used to receive a signal transmitted through a nonlinear channel.

The transfer function of IIR filter 612 is the inverse of the transfer function of the filter shown in FIG. 6A, 1/H(z). The feedforward and feedback connections of the linear filters in filter 612 are similar to those of filter 610; however, for a given linear filter, the coefficients of its feedforward and feedback filters are switched. For example, for a linear filter that includes feedforward filter 620 and feedback filter 622, the coefficient of the feedforward filter are $b_0$, $b_1$ and $b_2$, and the coefficients of the feedback filter are $a_0$, $a_1$ and $a_2$. The coefficients of other feedforward and feedback filter pairs are switched accordingly. The positions of the poles and zeros for the linear filter's transfer function are reversed compared to the linear filter set in FIG. 6A; therefore, the new transfer function is the inverse of P1(z). The corresponding transfer function for the linear filter is:

$$PI'(z) = \frac{b_0 + b_1 z^{-1} + b_2 z^{-2}}{a_0 + a_1 z^{-1} + a_2 z^{-2}} \quad \text{(Equation 13)}$$

Additionally, the roles of the min-max processors are reversed: what was a maximum processor is now a minimum processor and vice versa. The outputs of the first two filter sets are selected by a maximum processor 624. The output of the third filter set and the output of the maximum processor are selected by a minimum processor 626. The resulting nonlinear filter 612 is also an IIR filter.

In some embodiments, to ensure the stability of the linearized filter, the poles of the filter are selected to be inside the unit circle. Since the zeros of the linearized filter correspond to the poles of its inverse filter, the zeros are also selected to be inside the unit circle so the inverse filter is stable. Since the poles and zeros of a linearized filter are determined by linear functions, it is easy to control the poles and zeros while keeping the filter and its inverse stable.

Figure 7A:
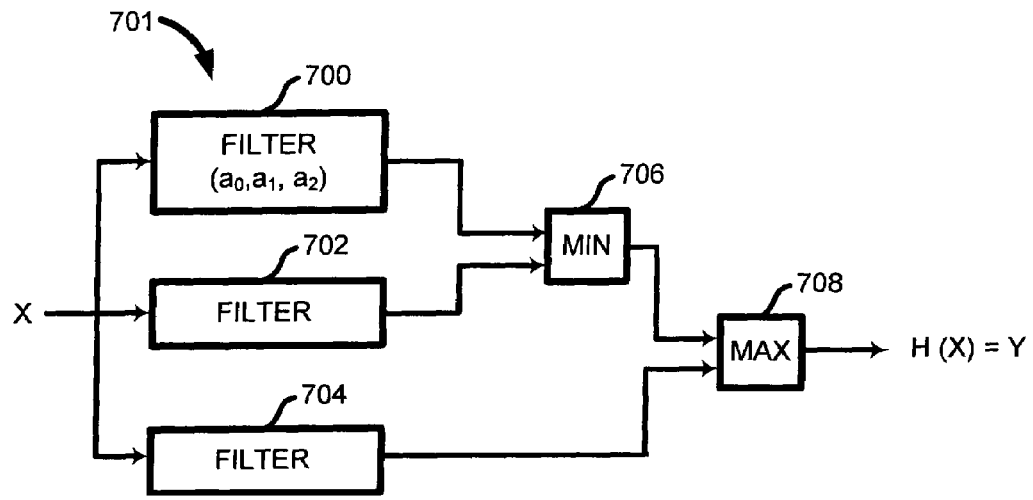
FIG. 7A is a block diagram illustrating the details of a finite impulse response (FIR) filter embodiment.

FIG. 7A is a block diagram illustrating the details of a finite impulse response (FIR) filter embodiment. The FIR filter, filter 701, does not include any feedback filters. Linear filters 700, 702 and 704 are feedforward filters connected to a minimum processor 706 and a maximum processor 708. Each of the feedforward filters has a set of coefficients. For example, the coefficients for filter 700 include $a_0$, $a_1$ and $a_2$.

Figure 7B:
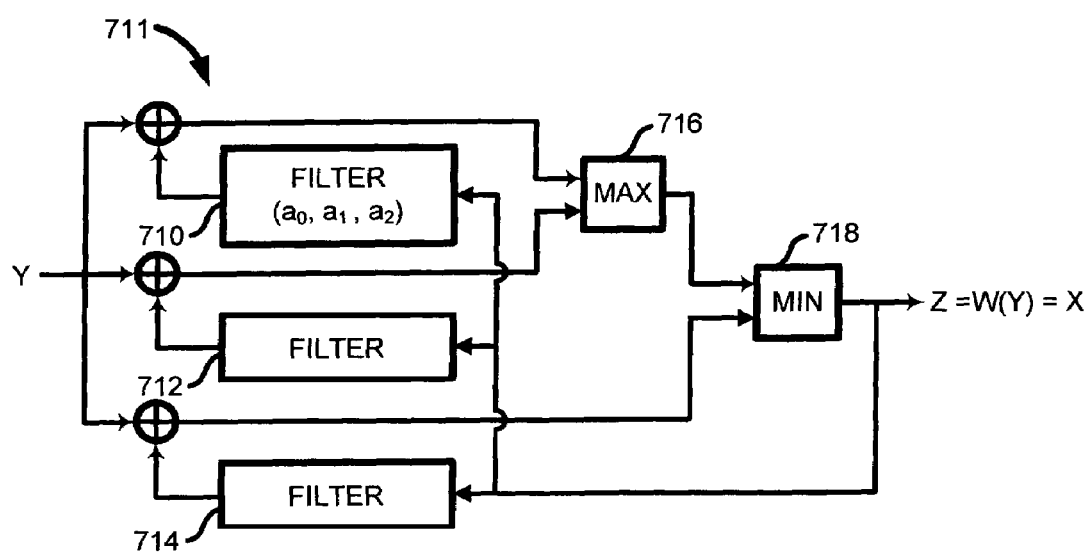
FIG. 7B is a block diagram illustrating an inverse filter embodiment for the filter shown in FIG. 7A.

FIG. 7B is a block diagram illustrating an inverse filter embodiment for the filter shown in FIG. 7A. Since filter 701 does not have any feedback elements, its inverse filter 711 does not have any feedforward elements. Instead, the input, X, is combined with feedback filters 710, 712 and 714. Each feedback filter has the same filter coefficients as its corresponding feedforward filter. For example, the coefficients of filter 710 are $a_0$, $a_1$ and $a_2$. The functions of the min-max processors 716 and 718 are reversed compared to min-max processors 706 and 708.

Figure 8A:
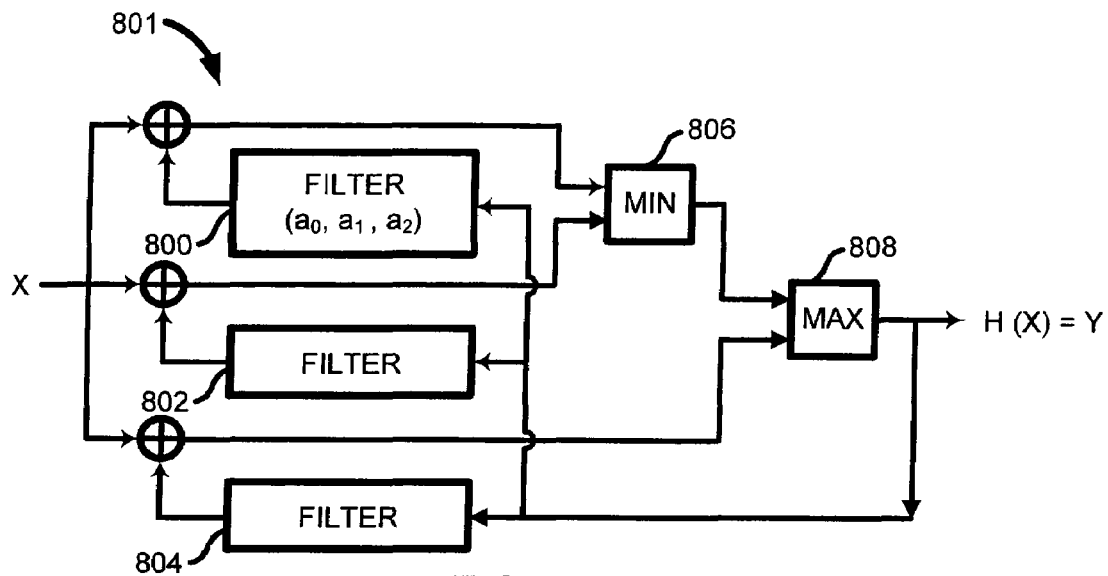
FIG. 8A is a block diagram illustrating another infinite impulse response filter embodiment.

FIG. 8A is a block diagram illustrating another infinite impulse response filter embodiment. The IIR filter, filter 801, does not include any feedforward filters. The input is combined with linear filters 800, 802 and 804, which are feedback filters connected to a minimum processor 806 and a maximum processor 808. As an example, the filter coefficients for filter 800 include $a_0$, $a_1$ and $a_2$.

Figure 8B:
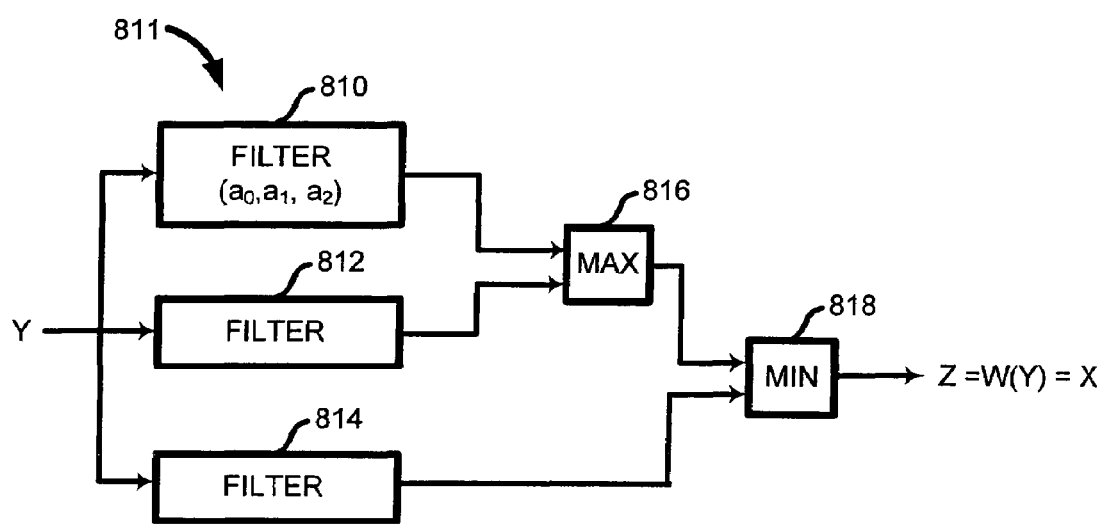
FIG. 8B is a block diagram illustrating an inverse filter embodiment for the filter shown in FIG. 8A.

FIG. 8B is a block diagram illustrating an inverse filter embodiment for the filter shown in FIG. 8A. The input to inverse filter 811 is sent to three feedforward filters. The coefficients of feedforward filters 810, 812 and 814 correspond to the coefficients of feedback filters 800, 802 and 804, respectively. The functions of the min-max processors 816 and 818 are reversed compared to min-max processors 806 and 808.

In some embodiments, the configurations of the inverse linearized channel model are determined adaptively rather than derived from the linearized channel model. The configurations include linear filter coefficients, min-max processor choices or any other appropriate parameters or properties that determine the transfer characteristics of the inverse channel model. The adaptation techniques are useful for constructing inverse filters used in receivers.

Figure 9:
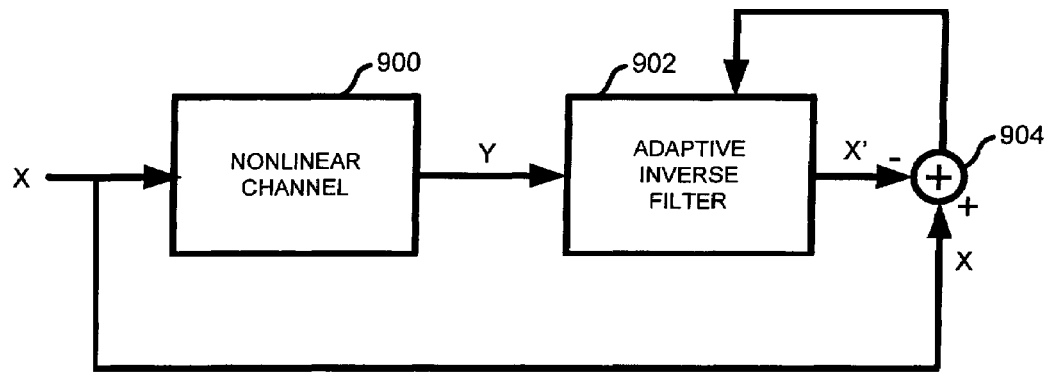
FIG. 9 is a block diagram illustrating an adaptive inverse filter embodiment.

FIG. 9 is a block diagram illustrating an adaptive inverse filter embodiment. A training input, X, is sent to a nonlinear channel 900. The output of the nonlinear channel, Y, is sent to an adaptive inverse filter 902 with an output X'. The difference between the training input and the output of filter 902 is determined by combiner 904, and propagated to the adaptive inverse filter. Filter 902 adapts its configurations accordingly to minimize the difference, using any appropriate adaptation methods (such as the LMS method) to adapt the configurations.

An improved technique for processing a signal propagated through a nonlinear channel has been disclosed. An inverse filter may be derived based on a linearized channel model, or derived adaptively. The resulting filter is easy to implement, stable and has good noise characteristics.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

The invention claimed is:

1. A method for processing a signal propagated through a nonlinear channel comprising:
    modeling the channel characteristics to produce a linearized channel model, wherein the linearized channel model has a linearized transfer function that includes a plurality of first order polynomials and nonlinear operators;
    deriving an inverse linearized channel model from the linearized channel model; and
    filtering the signal using the inverse linearized channel model.

2. A method for processing a signal propagated through a nonlinear channel as recited in claim 1 wherein the linearized channel model is refinable to reduce output error.

3. A method for processing a signal propagated through a nonlinear channel as recited in claim 1 wherein deriving the inverse linearized channel model includes algebraic computation.

4. A method for processing a signal propagated through a nonlinear channel as recited in claim 1 wherein deriving the inverse linearized channel model includes linear transformation.

5. A method for processing a signal propagated through a nonlinear channel comprising:
    modeling the channel characteristics to produce a linearized channel model;
    deriving an inverse linearized channel model from the linearized channel model, wherein deriving the inverse linearized channel model includes linear transformation and the linear transformation includes obtaining a mirror image of the nonlinear channel model and rotating the mirror image; and
    filtering the signal using the inverse linearized channel model.

6. A method for processing a signal propagated through a nonlinear channel comprising:
    modeling the channel characteristics to produce a linearized channel model, wherein the linearized channel model comprises a plurality of linear filters, a plurality of nonlinear elements each connected to one of the plurality of linear filters, and a combination network for combining the linear filters and the nonlinear elements;
    deriving an inverse linearized channel model from the linearized channel model; and
    filtering the signal using the inverse linearized channel model.

7. A method for processing a signal propagated through a nonlinear channel as recited in claim 6 wherein the nonlinear elements are minimum-maximum processors.

8. A method for processing a signal propagated through a nonlinear channel as recited in claim 7 wherein deriving an inverse linearized channel model includes deriving an inverse filter for each of the plurality of linear filters and inverting the function of each of the minimum-maximum processors.

9. A method for processing a signal propagated through a nonlinear channel as recited in claim 8 wherein deriving an inverse filter for the plurality of linear filters includes switching positions of poles and zeros of each of the plurality of linear filters.

10. A method for processing a signal propagated through a nonlinear channel as recited in claim 9 wherein switching positions of poles and zeros of each of the plurality of liner filters includes switching feedforward filter coefficients of the linear filter with feedback filter coefficients of the linear filter.

11. A method for processing a signal propagated through a nonlinear channel as recited in claim 1 wherein modeling the channel characteristics to produce a linearized channel model includes adjusting the poles of the linearized transfer function to be inside a unit circle.

12. A method for processing a signal propagated through a nonlinear channel as recited in claim 1 wherein modeling the channel characteristics to produce a linearized channel model includes adjusting the zeros of the linearized transfer function to be inside a unit circle.

13. A method for processing a signal propagated through a nonlinear channel as recited in claim 1 wherein adaptively determining an inverse linearized channel model includes using a least mean squared algorithm.

14. A nonlinear filter for processing a signal propagated through a nonlinear channel, comprising:
- a plurality of linear filters;
- a plurality of minimum-maximum processors; and
- a combination network configured to connect the linear filters and the minimum-maximum processors; wherein
- the nonlinear channel is modeled to produce a linearized channel model;
- an inverse linearized channel model is derived from the nonlinear channel; and
- the inverse linearized channel model is used to configure the nonlinear filter.

15. A nonlinear inverse filter for processing a signal propagated through a nonlinear channel, comprising:
- a plurality of linear filters;
- a plurality of minimum-maximum processors; and
- a combination network configured to connect the linear filters and the minimum-maximum processors; wherein
- the configuration of the nonlinear filter is determined adaptively.

16. A method for processing a signal propagated through a nonlinear channel as recited in claim 6 wherein the linearized channel model is refinable to reduce output error.

17. A method for processing a signal propagated through a nonlinear channel as recited in claim 6 wherein deriving the inverse linearized channel model includes algebraic computation.

18. A method for processing a signal propagated through a nonlinear channel as recited in claim 6 wherein deriving the inverse linearized channel model includes linear transformation.

19. A method for processing a signal propagated through a nonlinear channel as recited in claim 6, wherein adaptively determining an inverse linearized channel model includes using a least mean squared algorithm.

* * * * *